United States Patent
Dotsikas

(10) Patent No.: US 7,364,999 B2
(45) Date of Patent: Apr. 29, 2008

(54) METHOD FOR INTERCONNECTING SEMICONDUCTOR COMPONENTS WITH SUBSTRATES AND CONTACT MEANS

(75) Inventor: Ioannis Dotsikas, Dresden (DE)

(73) Assignee: Infineon Technologies AG, Munich (DE)

( * ) Notice: Subject to any disclaimer, the term of this patent is extended or adjusted under 35 U.S.C. 154(b) by 365 days.

(21) Appl. No.: 11/051,257

(22) Filed: Feb. 4, 2005

(65) Prior Publication Data

US 2006/0177969 A1    Aug. 10, 2006

(51) Int. Cl.
    *H01L 21/488*    (2006.01)
(52) U.S. Cl. ...................... 438/614; 438/612
(58) Field of Classification Search ................ 438/613, 438/614, 615
    See application file for complete search history.

(56) References Cited

U.S. PATENT DOCUMENTS 5,508,228 A * 4/1996 Nolan et al. ................ 438/614
5,907,785 A * 5/1999 Palagonia ................... 438/613
6,897,568 B2 * 5/2005 Haimerl et al. ............. 257/779
2003/0067755 A1    4/2003 Haimerl et al.

FOREIGN PATENT DOCUMENTS

WO    WO 01/75969 A1    10/2001

* cited by examiner

*Primary Examiner*—Mary Wilczewski
*Assistant Examiner*—Pamela E Perkins
(74) *Attorney, Agent, or Firm*—Slater & Matsil, L.L.P.

(57) ABSTRACT

A semiconductor component includes a substrate having a plurality of compliant contact bumps formed over a surface thereof. A semiconductor chip has a plurality of contact regions formed over a surface thereof. The compliant contact bumps of the substrate are electrically connected with the contact regions of the semiconductor chip and wherein the semiconductor chip is mechanically attached to the substrate. As an example, this connection and attachment can be achieved by soldering the contact bumps to the contact regions.

26 Claims, 2 Drawing Sheets

METHOD FOR INTERCONNECTING SEMICONDUCTOR COMPONENTS WITH SUBSTRATES AND CONTACT MEANS

TECHNICAL FIELD

The invention is directed at a method for interconnecting semiconductor components with substrates such as printed circuit boards with one ore more layers, other boards or carriers.

BACKGROUND

Well known semiconductor components have a very high degree of integration and require many production steps performed in the wafer level compound leading to an expensive thermal load for the semiconductor component. Therefore the aim is to reduce the thermal load of the semiconductor component such that the maximal given thermal budget will not be exceeded.

Another viewpoint can be seen in the fact that assembling of semiconductor elements on substrates or printed circuit boards like the known BOC (board on chip) technology leads to the difficulty that different thermal expansion coefficients of the used components after assembling and during the burn-in or the later use leads to thermal tension between the components and the printed circuit board. This thermal tension results in an enormous mechanical load of the solder contacts. It is possible to reduce the thermal tensions by selection of suitable materials, but it is not possible to throw away the thermal tensions completely.

A significant improvement was reached by the development of the so-called elastec technology, which uses elastic or compliant contact elements made of an elastomer like silicon, so-called silicon bumps.

From the international laid open application published under the number WO 01/75969 A1, which is incorporated herein by reference, is known an electronic component with compliant contact bumps. The compliant contact bumps comprise rubber or silicon and can be self conductive or can be provided with a contact pad on the tip of it connected with a contact pad on the semiconductor element via a reroute layer.

Such reroute layers are made of metal with a multi layer structure with a nickel layer as the base covered by a copper layer and a gold layer coating the copper layer and protecting the copper layer from oxidation. The gold layer also secures a good solder ability of the contact pad on the tip of the compliant element.

The mentioned reroute layers are structured by the known technologies of photolithography to produce masks on the surface on the semiconductor component followed by metal deposition to realize the reroute layer itself and the contact pads simultaneously. It seems to be clear that it is not possible to avoid additional thermal load during the mentioned processes. Beyond, it is necessary to dismiss such semiconductor elements with faults in the structure of the reroute layer. This leads to financial disadvantages for the producer.

Assembling the compliant elements on the surface of the semiconductor component can be performed with the known technologies of printing especially by silk-screen printing.

Then the semiconductor components provided with the described contact elements are soldered on a substrate like a printed circuit board by such a way that every contact element on the semiconductor element is connected with a corresponding contact pad on the substrate usually by reflow soldering.

SUMMARY OF THE INVENTION

In one aspect, the invention realizes an effective method for interconnecting semiconductor components with substrates such as printed circuit boards with one or more layers, other boards or carriers.

In another aspect, the invention provides a contact means suitable for contacting with semiconductor components.

In yet another aspect, the invention reduces the manufacturing costs for semiconductor elements.

In a further aspect, the invention reduces the thermal load during the manufacturing process of the semiconductor components.

According to the preferred embodiment of the invention, the semiconductor components are provided with solderable contact pads and the substrate is provided with compliant contact bumps delivered on the surfaces of the substrate according the scheme of the contact pads on the semiconductor component with solderable contact pads at least on the tip of the compliant bumps. The contact pads on the tip of the compliant contact bumps are connected with reroute layers of the substrate. The contact pads on the semiconductor element are electrically and mechanically connected with the compliant contact bumps by soldering.

It is preferred to print the compliant bumps on the surface of the substrate, e.g., by silk-screen printing.

It is possible to manufacture the compliant bumps of a electrical leading material.

Another possibility is to adhere the compliant bumps on the surface of the substrate with an adhesive.

In a further variation of the invention, the compliant bumps are provided with contact pads and reroute layers by photolithography steps and masking technology and galvanic or thermal deposition of metal layers. The reroute layers connect the contact pads on the tip of the compliant bump with metal layers on the substrate.

Before the compliant bumps are printed on the surface of the substrate the material of the compliant contact bumps can be mixed with metallic components so that compliant contact bumps become electrically conductive.

A special variation of the invention is characterized by a substrate with a plurality of compliant contact bumps on the substrate and semiconductor components mounted on the compliant bumps side-by-side and that the substrate then is divided into individual semiconductor components.

The separation into individual semiconductor components can be performed by sawing or other cutting methods.

According another variation of the invention with a means for contacting of semiconductor components, the substrate is provided with elastic or compliant contact bumps which are electrically connected with contact pads on the substrate via wiring or similar. The contact bumps are electrically and mechanically connected with respective contacts on semiconductor components by soldering.

It is possible to make the compliant contact bumps of a plastic material like silicone, plastics or rubber.

It is also possible to assemble different semiconductor components on the substrate, like logic elements, processors and memories in groups side-by-side. Then the functional groups can be divided into individual semiconductor elements by cutting or sawing according the groups that belong together.

The invention allows to carry out all yield limiting steps such as thermal treatment steps on the cost effective substrate (printed circuit board or PCB). The advantage is, in the case that contact bumps (silicon bumps) and wiring are not perfectly assembled, the PCB can be rejected with the result that expensive semiconductor elements are not risked. Furthermore, the quality and stability of the contact bumps on the PCB can be controlled perfectly.

On the semiconductor wafer are assembled only contact pads for soldering with the contact bumps, which can be performed with a RDL (redistribution layer).

The exposition of the wafer with higher temperatures and also the risk to destroy individual chips by handling and manufacturing errors during the assembling of the silicon bumps is prevented.

Furthermore, it is possible to test the semiconductor elements by contacts or special provided needle control points on the semiconductor elements.

Finally, the invention allows complete assembly of manufactured semiconductor components on any one substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
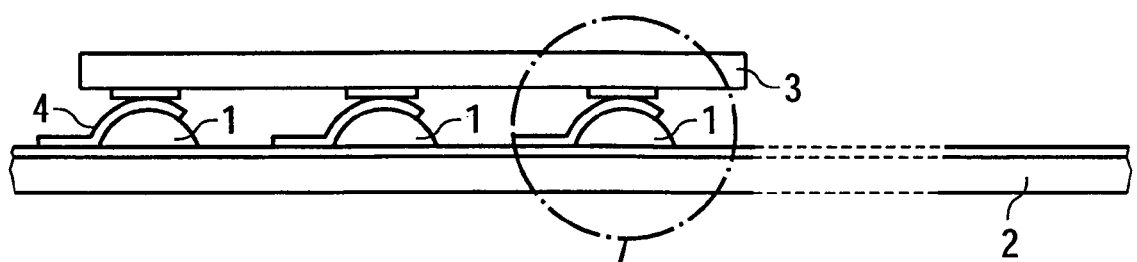
FIG. 1 shows a schematic illustration of a substrate provided with compliant contact bumps together with a semiconductor element attached to it.
Figure 3:
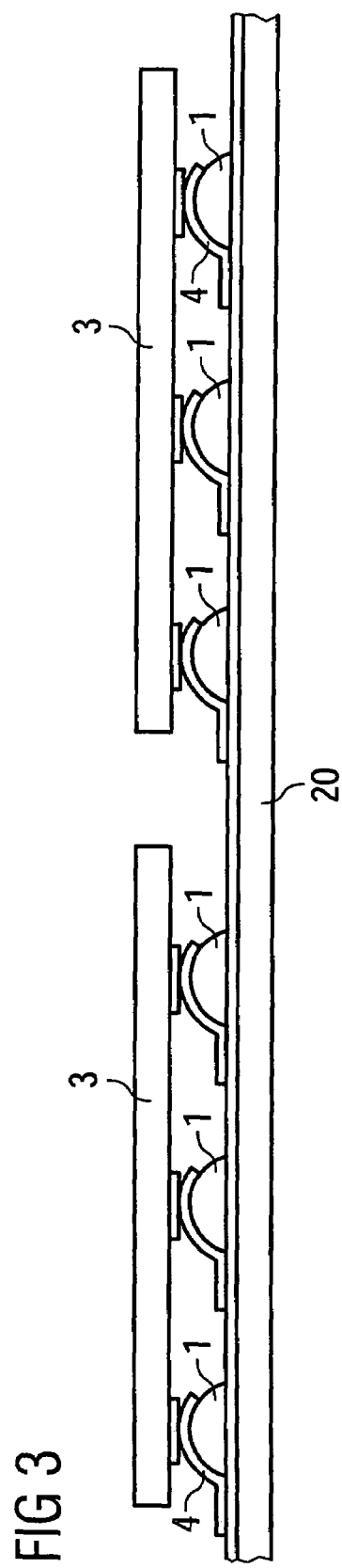
FIG. 3 shows a schematic illustration of a substrate and more than one semiconductor component attached to it.

FIG. 1 shows a schematic illustration of a substrate 2 provided with compliant contact bumps 1 with a semiconductor component 3 (e.g., a semiconductor die or chip), which is connected to the substrate 2 by, e.g., soldering. There is shown only a small section of a greater substrate. On the substrate 2, which can be a printed circuit board, there can be mounted many semiconductor components 3, such as logic elements, processors and memories side-by-side, e.g., in groups or functional elements with a number of semiconductor components as shown in FIG. 3, which shows two semiconductor components 3. This reduces the expense of manufacturing. After that, the substrate 2 can be divided into individual semiconductor groups or functional elements by sawing or another cutting method. Alternatively, a multi chip component can be produced.

In the preferred embodiment, the semiconductor component 3 includes active circuitry formed in and above a semiconductor material. This active circuitry can form devices such as logic elements, processors and memories, as discussed above. The substrate 2, on the other hand, preferably has no active circuitry and is provided as a carrier.

As can be seen from FIG. 1, each of the contact bumps 1 is provided with a wiring 4 which connects the contact pad 5 on the compliant contact bump 1 with a wiring 4 on the substrate 2. The wiring 4 and the contact pads 5 are manufactured by the known photolithography and mask technology and by galvanic or thermal deposition of metal.

Figure 2:
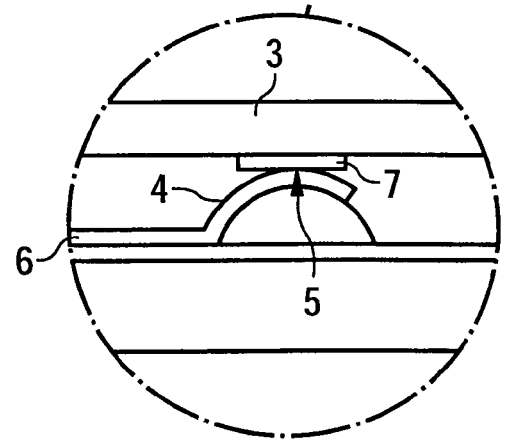
FIG. 2 illustrates an enlarged section according FIG. 1.

Furthermore, the semiconductor elements 3 are provided with solderable contact pads 7 to secure a good electrical contact with the contact pad 5 on the compliant contact bump 1 (FIG. 2). In other embodiments, electrical and mechanical connection by means other than solder (e.g., conductive epoxy) can be accomplished.

It is possible to mount the compliant contact bumps 1 on the substrate 2 by printing, e.g., silk-screen printing or by adhering with a resist.

Instead of providing the contact bumps 1 with a wiring, it is also possible to realize self leading compliant contact bumps by admixture of metal particles.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for interconnecting a semiconductor component with a substrate, the method comprising:

providing a substrate with contacts, each of the contacts comprising a compliant contact bump and a conductive contact pad overlying a tip of the compliant contact bump, the conductive contact pads being electrically coupled with leads on the substrate, wherein the substrate has no active circuitry formed within the substrate;

providing a semiconductor component with contacts for interconnecting with the contact pads on the substrate, the contacts on the semiconductor component and the contact pads on the substrate being arranged in a like configuration, wherein the semiconductor component includes active circuitry formed in and above a semiconductor material; and electrically coupling the semiconductor component contacts to the contact pads.

2. The method of claim 1, wherein electrically coupling the semiconductor component contacts to the contact pads comprises soldering the semiconductor component contacts to the contact pads to realize a solder connection.

3. The method of claim 2, wherein the solder connection achieves electrical and mechanical contact between the substrate and the semiconductor component.

4. The method of claim 2, further comprising attaching a plurality of semiconductor components to compliant contact bumps on the substrate such that the semiconductor components can be mounted side-by-side by soldering.

5. The method of claim 4, further comprising dividing the substrate into individual semiconductor elements, each semiconductor element including at least one semiconductor component.

6. The method of claim 5, wherein dividing the substrate into individual semiconductor elements comprises sawing.

7. The method of claim 1, wherein the substrate comprises a printed circuit board with one or more layers.

8. The method of claim 1, further comprising printing the compliant contact bumps on a surface of the substrate.

9. The method of claim 8, wherein the compliant contact bumps are formed by mixing a compliant material with an electrically conductive material before printing the compliant contact bumps on the surface of the substrate.

10. The method of claim 1, wherein the compliant contact bump element is made of an electrically conductive material.

11. The method of claim 10, wherein the compliant contact bumps are secured on a surface of the substrate by adhering.

12. The method of claim 1, wherein the contacts on the substrate are formed by forming the contact pads over the compliant contact bumps and by forming metal leads over the substrate such that the contact pad at the tip of each compliant element is electrically connected with the metal leads over the substrate.

13. The method of claim 12, wherein the contact pads and the metal leads are formed by photolithographic technology and by galvanic or thermal deposition of metal.

14. The method of claim 1, wherein the substrate comprises a printed circuit board.

15. A semiconductor component comprising:
a substrate having a plurality of compliant contact bumps formed over a surface thereof; and
a semiconductor chip having a plurality of contact regions formed over a surface thereof, wherein the compliant contact bumps of the substrate are electrically connected with the contact regions of the semiconductor chip, wherein the semiconductor chip is mechanically attached to the substrate, and wherein the semiconductor chip includes active circuitry formed in and above a semiconductor material, and wherein the substrate has no active circuitry formed within the substrate.

16. The semiconductor component of claim 15, wherein the compliant contact bumps are electrically connected with the contact regions and the semiconductor chip is mechanically attached to the substrate by solder connections between the compliant contact bumps and the contact pads.

17. The semiconductor component of claim 15, wherein the compliant contact bumps comprise a material selected from the group consisting of plastic materials, silicone and rubber.

18. The semiconductor component of claim 15, wherein the active circuitry comprises a processor.

19. The semiconductor component of claim 15, wherein the semiconductor chip comprises a memory chip.

20. The semiconductor component of claim 15, further comprising an additional semiconductor chip having a plurality of contact regions formed over a surface thereof, wherein the compliant contact bumps of the substrate are electrically connected with the contact regions of the additional semiconductor chip, and wherein the additional semiconductor chip is mechanically attached to the substrate at a location laterally adjacent the semiconductor chip.

21. A semiconductor component comprising:
a printed circuit board having a plurality of compliant contact bumps formed over a surface thereof; and
a semiconductor chip having a plurality of contact regions formed over a surface thereof, wherein the compliant contact bumps of the printed circuit board are electrically connected with the contact regions of the semiconductor chip, wherein the semiconductor chip is mechanically attached to the printed circuit board, wherein the semiconductor chip includes active circuitry formed in and above a semiconductor material, and wherein no active circuitry is disposed within the printed circuit board.

22. A semiconductor component comprising:
a printed circuit board having a plurality of compliant contact bumps formed over a surface thereof;
a semiconductor chip having a plurality of contact regions formed over a surface thereof, wherein the compliant contact bumps of the printed circuit board are electrically connected with the contact regions of the semiconductor chip, wherein the semiconductor chip is mechanically attached to the printed circuit board, and wherein the semiconductor chip includes active circuitry formed in and above a semiconductor material; and
an additional semiconductor chip having a plurality of contact regions formed over a surface thereof, wherein the compliant contact bumps of the printed circuit board are electrically connected with the contact regions of the additional semiconductor chip, and wherein the additional semiconductor chip is mechanically attached to the printed circuit board at a location laterally adjacent the semiconductor chip.

23. The semiconductor component of claim 22, wherein the compliant contact bumps are electrically connected with the contact regions of the semiconductor chip, and the semiconductor chip is mechanically attached to the printed circuit board by solder connections between the compliant contact bumps and contact pads.

24. The semiconductor component of claim 22, wherein the compliant contact bumps comprise a material selected from the group consisting of plastic materials, silicone and rubber.

25. The semiconductor component of claim 22, wherein the active circuitry comprises a processor.

26. The semiconductor component of claim 22, wherein the semiconductor chip comprises a memory chip.

* * * * *